United States Patent [19]

Kang

[11] Patent Number: 5,602,797
[45] Date of Patent: Feb. 11, 1997

[54] WORD LINE DRIVING CIRCUIT FOR MEMORY

[75] Inventor: Chang M. Kang, Kyungki-Do, Rep. of Korea

[73] Assignee: LG Semicon Co., Ltd., Rep. of Korea

[21] Appl. No.: 542,456

[22] Filed: Oct. 12, 1995

[30] Foreign Application Priority Data

Oct. 13, 1994 [KR] Rep. of Korea ............... 26225/1994

[51] Int. Cl.$^6$ ................................................ G11C 8/00
[52] U.S. Cl. .............................. 365/230.06; 365/189.08
[58] Field of Search ......................... 365/230.06, 206, 365/189.08, 189.05, 194; 326/105

[56] References Cited

U.S. PATENT DOCUMENTS

| | | | |
|---|---|---|---|
| 5,297,104 | 3/1994 | Nakashima | 365/230.06 |
| 5,351,217 | 9/1994 | Jeon | 365/230.06 |
| 5,412,331 | 5/1995 | Jun et al. | 365/230.06 |
| 5,461,593 | 10/1995 | Kim | 365/230.06 |
| 5,467,032 | 11/1995 | Lee | 365/230.06 |

*Primary Examiner*—Tan T. Nguyen

[57] ABSTRACT

An improved word line driving circuit for a memory capable of decoding a free-decoded low address signal to an eternally applied voltage level and driving a word line using a power-up voltage level of a memory, thus advantageously achieving a low voltage consumption for driving a word line, which includes a decoder for decoding free-decoded first through third low address signals and an externally applied control signal and for outputting a decoding signal of a voltage level or a low level; a switch for outputting a free-decoded word line enable signal of a power-up voltage level or a low level switched in accordance with a decoding signal outputted from the decoder; a word line selector for outputting a word line selection signal of a power-up voltage and for selecting a word line in accordance with a word line enable signal outputted from the switch; and a word line stabilization circuit for stabilizing the level of a word line selected by the word line selector in accordance with a word line enable signal outputted from the switch.

7 Claims, 5 Drawing Sheets

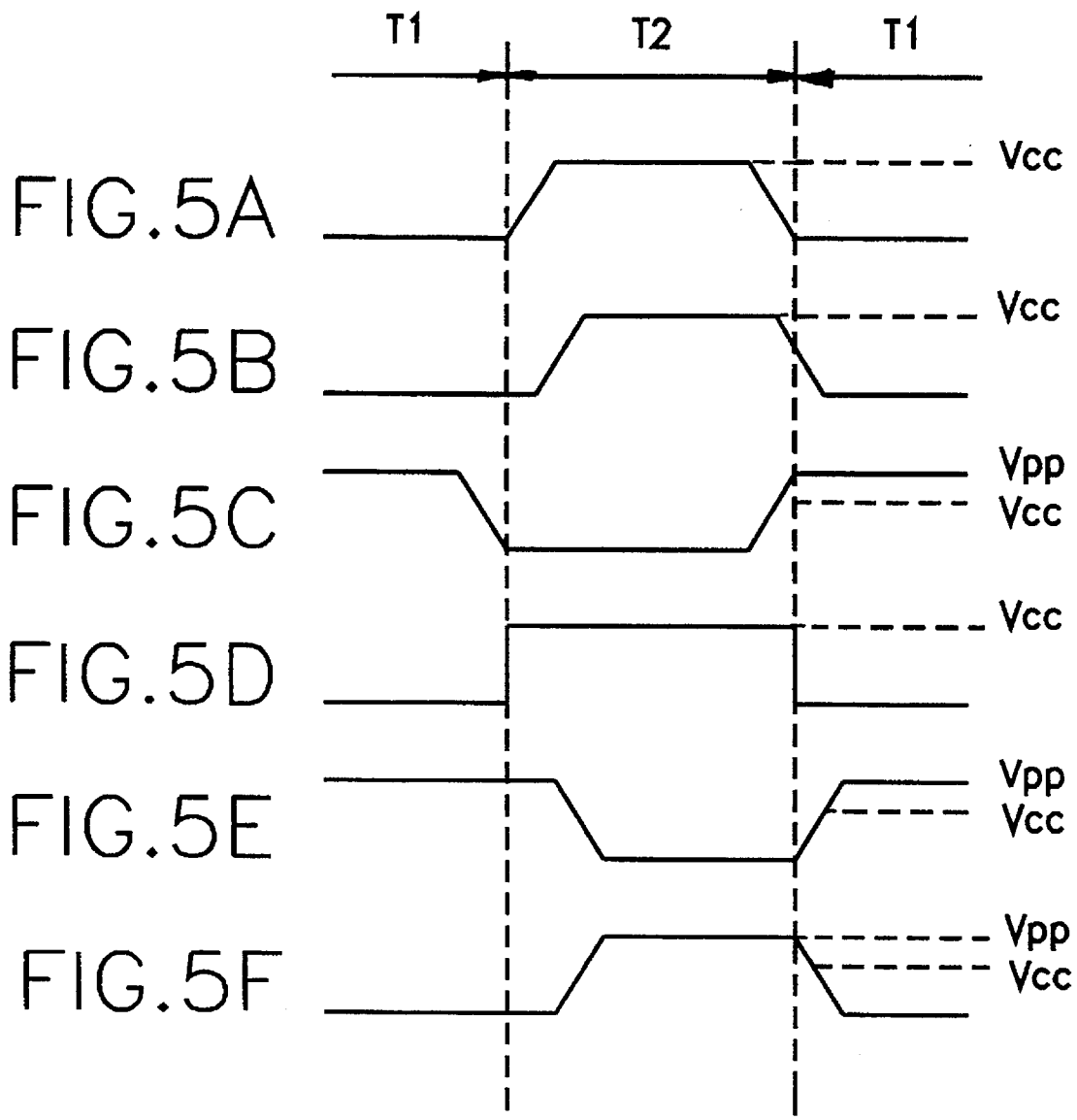

5,602,797

WORD LINE DRIVING CIRCUIT FOR MEMORY

BACKGROUND OF THE INVENTION

1. Field of the Invention

The present invention relates to a word line driving circuit for a memory, and particularly to an improved word line driving circuit for a memory capable of decoding a flee-decoded low address signal to an externally applied voltage level and driving a word line using a power-up voltage level of a memory, thus advantageously achieving a low voltage consumption for driving a word line.

2. Description of the Conventional Art

Referring to FIG. 1, a first conventional word line driving circuit for a memory includes an NAND gate 100 for NANDing externally applied and free-decoded low address signal $DRA_{ij}$, $DRA_{kl}$, and $DRA_{mn}$ and for outputting a logic signal of a power-up voltage $V_{pp}$ level or a low level, a latch 200 for delaying the logic signal outputted from the NAND gate 100 for a predetermined time and for outputting an inverted logic signal, an invertor 300 for inverting the logic signal outputted from the latch 200 and for outputting an inverted signal of a power-up voltage $V_{pp}$ level or a low level, a word line selector 400 for outputting a word line selection signal φXi free-decoded by the invertor 300 and for selecting a word line W/L, and a word line stabilization circuit 500 for stabilizing the level of a word line in accordance with the inverting signal φXiB of the word line selection signal φXi.

The NAND gate 100 includes a PMOS transistor 51 having a source terminal connected to a power-up voltage $V_{pp}$ terminal and a gate terminal connected to an input line of a low address signal $DRA_{ij}$, an NMOS transistor 52 having a drain terminal connected to the drain terminal of the PMOS transistor 51 and a gate terminal connected to the gate terminal of the PMOS transistor 51, an NMOS transistor 53 having a drain terminal connected to the source terminal of the NMOS transistor 52 and a gate terminal connected to the input line of the low address signal $DRA_{kl}$, and an NMOS transistor 54 having a drain terminal connected to the source terminal of the NMOS transistor 53 and a gate terminal connected to the input line of the low address signal $DRA_{mn}$.

The latch 200 includes a PMOS transistor 55 having a source terminal connected to the power-up voltage $V_{pp}$ terminal and a gate terminal connected to the common output line of the NAND gate 100, an NMOS transistor 56 having a drain terminal connected to the drain terminal of the PMOS transistor 55 and a gate terminal connected to the gate terminal of the PMOS transistor 55, and a PMOS transistor 57 having a source terminal connected to the power-up voltage $V_{pp}$ terminal and a gate terminal commonly connected to the PMOS transistor 55 and the NMOS transistor 56 and a drain terminal connected to the common output line of the NAND gate 100.

The invertor 300 includes a PMOS transistor 58 having a source terminal connected to the power-up voltage $V_{pp}$ terminal and a gate terminal connected to the common output line of the latch 200, and an NMOS transistor 59 having a drain terminal connected to the drain terminal of the PMOS transistor 58 and a gate terminal connected to the gate terminal of the PMOS transistor 58 and a source terminal connected to the ground voltage $V_{ss}$ terminal.

The word line selector 400 includes a PMOS transistor 60 having a source terminal connected to the input line of the word line selection signal φXi and a gate terminal connected to the common line of the invertor 300, and an NMOS transistor 61 having a drain terminal connected to the drain terminal of the PMOS transistor 60 and a gate terminal connected to the gate terminal of the PMOS transistor 60 and a source terminal connected to the ground voltage $V_{ss}$.

The word line stabilization circuit 500 includes an NMOS transistor 500 having a drain terminal connected to the word line W/L and a gate terminal connected to the input line of the inverting signal φXiB of the word line selection signal φXi.

In addition, referring to FIG. 2, a second conventional word line driving circuit for a memory includes an NAND gate 100' for NANDing free-decoded low address signals $DRA_{ij}$, $DRA_{kl}$, and $DRA_{mn}$ and for outputting a logic signal of an external voltage $V_{cc}$ level or a low level, a latch 200' for delaying the level of the logic signal outputted from the NAND gate 100' and for outputting an inverted logic signal, an invertor 300' for inverting the logic signal outputted from the latch 200' and for outputting the invertor logic signal of a voltage $V_{cc}$ level, a level controller 600 for controlling the level of the logic signal outputted from the invertor 300' in accordance with the free-decoded word line selection signal φXi and the word line W/L, and a word line selector 400' for outputting a word line selection signal of a power-up voltage $V_{pp}$ level in accordance with a level of the logic signal controlled by the level controller 600 and for selecting a word line W/L.

The NAND gate 100' includes a PMOS transistor 71 having a source terminal connected to a voltage $V_{cc}$ terminal and a gate terminal connected to a low address signal $DRA_{ij}$ line, an NMOS transistor 72 having a drain terminal connected to the drain terminal of the PMOS transistor 71 and connected to a common output line and a gate terminal connected to the gate terminal of the PMOS transistor 71, an NMOS transistor 73 having a drain terminal connected to the source terminal of the NMOS transistor 72 and a gate terminal connected to the input line of the low address signal $DRA_{kl}$, and an NMOS transistor 74 having a drain terminal connected to the source terminal of the NMOS transistor 73 and a gate terminal connected the input line of the low address signal $DRA_{mn}$ and a source terminal connected to a ground voltage $V_{ss}$.

The latch 200' includes a PMOS transistor 75 having a source terminal connected to a voltage $V_{cc}$ and a gate terminal connected to a common output line of the NAND gate 100', an NMOS transistor 76 having a drain terminal connected to the drain terminal of the PMOS transistor 75 and connected to a common output line and a gate terminal connected to the gate terminal of the PMOS transistor 75 and a source terminal connected to the voltage $V_{cc}$, and a PMOS transistor 77 having a source terminal connected to the power $V_{cc}$ and a gate terminal connected to a common output line of the PMOS transistor 75 and the NMOS transistor 76 and a drain terminal connected to a common output line of the NAND gate 100'.

The invertor 300' includes a PMOS transistor 78 having a source terminal connected to the voltage $V_{cc}$ and a gate terminal connected to a common output line of the latch 200', and an NMOS transistor 79 having a drain terminal connected to the drain terminal of the PMOS transistor 78 and a gate terminal connected to the gate terminal of the PMOS transistor 78 and a source terminal connected to the voltage $V_{ss}$ The level controller 600 includes an NMOS transistor 80 having a drain terminal connected to a common output line of the invertor 300' and a gate terminal connected to the input line of the word line selection signal φXi, and a PMOS transistor 81 having a source terminal connected to a power-up voltage $V_{pp}$ and a gate terminal connected to a word line W/L and a drain terminal connected to the source terminal of the NMOS transistor 80 and connected to the common output line.

The word line selector 400' includes a PMOS transistor 82 having a source terminal connected to a power-up voltage $V_{pp}$ terminal and a gate terminal connected to a common output line of the level controller 600, and an NMOS transistor 83 having a drain terminal connected to the drain terminal of the PMOS transistor 82 and a gate terminal connected to the gate terminal of the PMOS transistor 82 and a source terminal connected to a ground voltage $V_{ss}$.

In addition, referring to FIG. 3, a third conventional word line driving circuit for a memory includes an NAND gate 700 for NANDing free-decoded low address signals $DRA_{ij}$, $DRA_{kl}$, and $DRA_{mn}$ and for outputting a logic signal of a power-up voltage $V_{pp}$ level and a low level, an invertor 702 for inverting the logic signal outputted from the NAND gate 700 to a power-up voltage $V_{pp}$ level or a low level, an invertor for inverting the logic signal inverted by the invertors 701 and 702, respectively, and for outputting a free-decoded word line selection signal φXi and for selecting a word line W/L.

The NAND gate 700 includes a PMOS transistor 101 having a source terminal connected to a power-up voltage $V_{pp}$ terminal and a gate terminal connected to an input line of the low address signal $DRA_{ij}$, a PMOS transistor 102 having a source terminal connected to the source terminal of the PMOS transistor 101 and a gate terminal connected to the output terminal of the invertor 701 and a drain terminal connected to the drain terminal of the PMOS transistor 101, an NMOS transistor 103 having a drain terminal connected to a common output line of the drain terminals of the PMOS transistors 101 and 102 and a gate terminal connected to the gate terminal of the PMOS transistor 101, an NMOS transistor 104 having a drain terminal connected to the source terminal of the NMOS transistor 103 and a gate terminal connected to the input line of a free-decoded low address signal $DRA_{jk}$, and an NMOS transistor 105 having a drain terminal connected to the source terminal of the NMOS transistor 104 and a gate terminal connected to the input line of a free-decoded low address signal $DRA_{mn}$ and a source terminal connected to a ground voltage $V_{ss}$.

The word line selector 703 includes a transmission gate TM for transmitting a flee-decoded word line selection signal φXi to a word line W/L in accordance with a logic signal outputted from the invertors 701 and 702, and an NMOS transistor 108 for controlling the level of the word line selection signal φXi transmitted to the word line W/L in accordance with a logic signal outputted from the invertor 702.

The transmission gate TM includes a PMOS transistor 106 having a source terminal connected to the input line of the word line selection signal φXi and a gate terminal connected to the output line of the invertor 702, and an NMOS transistor 107 having an NMOS transistor 107 having a drain terminal connected to the source terminal of the PMOS transistor 106 and a gate terminal connected to the output line of the invertor 701 and a source terminal connected to the drain terminal of the PMOS transistor 106 and commonly connected to the word line W/L and the NMOS transistor 108.

The operation of the first word line driving circuit for a memory will now be explained.

To begin with, low address signals $DRA_{ij}$, $DRA_{kl}$, and $DRA_{mn}$ are applied to each gate terminal of the PMOS transistor 51, the NMOS transistor 52, and the NAND gates 53 and 54 of the NAND gate 100, respectively.

Thereafter, the PMOS transistor 51 is turned on and the NMOS transistor 52 is turned off in accordance with a low address signal $DRA_{ij}$ of a low level commonly applied to the gate terminals, and the NMOS transistor 53 is turned off in accordance with a low address signal $DRA_{kl}$ of a low level applied thereto, and the NMOS transistor 54 is mined off in accordance with a low address signal $DRA_{mn}$ of a low level applied thereto.

Therefore, since a high level signal of a power-up voltage $V_{pp}$ level is outputted through the PMOS transistor 51 and the NMOS transistor 52, the node N1 outputs a high level signal of the power-up voltage $V_{pp}$.

Thereafter, the PMOS transistor 55 and the NMOS transistor 56 of the latch 200 each are turned off and turned on in accordance with the power-up voltage $V_{pp}$ level applied to the node V1 and output the low signal through a common lie.

Therefore, a low signal is applied to a node N2.

The PMOS transistor 57 of the latch 200 receives the low signal from the node N2 through the gate terminal thereof and is turned on and outputs a high level signal of a power-up voltage $V_{pp}$ through the drain terminal thereof, and a high level signal of a power-up voltage $V_{pp}$ level is checked at the node N1.

In addition, since the high level signal of a power-up voltage $V_{pp}$ level is commonly applied to the gate terminals of the PMOS transistor 55 and the NMOS transistor 56, respectively, the PMOS transistors 55 and 57 and the NMOS transistor 56 of the latch 200 become alternately activated, so that a high level signal of a power-up voltage $V_{pp}$ level can be checked at the node N1 for a predetermined time.

Thereafter, since the PMOS transistor 58 and the NMOS transistor 59 of the invertor 300 each are turned on and turned off i accordance with a low signal outputted from the latch, high level signals of a power-up voltage $V_{pp}$ level is outputted from the PMOS transistor 58 and the NMOS transistor 59, so that a high level signal of a power-up voltage $V_{pp}$ can be checked at a node N3.

Thereafter, the PMOS transistor 60 and the NMOS transistor 61 of the word line selector 300 each are turned on and turned on in accordance with a high level signal of a power-up voltage $V_{pp}$ applied to the node 3.

Therefore, low level signals are outputted from the PMOS transistor 60 and the NMOS transistor 61 through a common output line, and the NMOS transistor 62 of the word line stabilization circuit 500 is turned on in accordance with a word line selection signal φXi and an inverting signal φXib applied thereto, so that the word line W/L does not become activated.

Thereafter, when low address signals $DRA_{ij}$, $DRA_{kl}$ and $DRA_{mn}$ of a high level are applied to the PMOS transistor 51, the NMOS transistor 52, and the NMOS transistors 53 and 54, respectively, the PMOS transistor 51 and the NMOS transistor 52 are turned off and turned on, respectively, in accordance with a low address signal $DRA_{ij}$ of a high level commonly applied to the gate terminals thereof.

In addition, the NMOS transistor 53 is turned on in accordance with a low address signal $DRA_{kl}$ of a high level applied to its gate terminal, and the NMOS transistor 54 is turned on in accordance with a low address signal $DRA_{mn}$ of a high level applied to its gate terminal.

Therefore, a low level signal is outputted through the PMOS transistor 51 and the NMOS transistor 52, and a low level signal is checked at the node N1.

Thereafter, the PMOS transistor 55 and the NMOS transistor 56 are turned on and turned off in accordance with a low level signal outputted from the node 1 and output a high level signal of a power-up voltage $V_{pp}$ level.

Therefore, the a high level signal of a power-up voltage $V_{pp}$ level is checked at the node N2.

In addition, since the PMOS transistor 57 is turned off in accordance with a high level signal of a power-up voltage $V_{pp}$ level, and a low level signal is checked at the node N1.

Thereafter, the PMOS transistor 58 and the NMOS transistor 59 are turned off and turned on, respectively, in accordance with a high level signal of the power-up voltage $V_{pp}$ level checked at the node N2 and output a low level signal through a common output terminal. In addition, a low level signal is checked at the node N3.

Thereafter, the PMOS transistor 60 and the NMOS transistor 61 are turned on and turned off i accordance with a low signal checked at the node N3, and the NMOS transistor 62 is turned off in accordance with an inverting signal φXiB of a word line selection signal φXi of a low level signal, and a word line selection signal of a high level outputted through a common output line of the PMOS transistor 60 and the NMOS transistor 61 is outputted and a word line W/L is driven in accordance with the word line selection signal outputted therefrom.

The operation of a second conventional word line driving circuit for a memory will now be explained with reference to FIG. 2.

To begin with, when low address signals $DRA_{ij}$, $DRA_{kl}$, and $DRA_{mn}$ of a low level are applied to the PMOS transistor 71, the NMOS transistor 72 and the NMOS transistors 73 and 74 of the NAND gate 100', respectively, the PMOS transistor 71 and the NMOS transistor 72 are turned on and turned off, respectively, in accordance with a low address signal $DRA_{ij}$ of a low level signal commonly applied to the gate terminals thereof.

In addition, the NMOS transistor 73 is turned off in accordance with a low address signal $DRA_{kl}$ of a low level signal applied to its gate terminal, and the NMOS transistor 74 is turned off in accordance with a low address signal of a low level applied to its gate terminal.

Therefore, a high level signal of a voltage $V_{cc}$ is outputted from the PMOS transistor 71 and the NMOS transistor 72 through a common output line thereof, and a high level signal of a power-up voltage $V_{pp}$ is checked at a node N11.

Thereafter, the PMOS transistor 75 and the NMOS transistor 76 of the latch 200' are turned off and mined on, respectively, in accordance with a high level signal of a voltage $V_{cc}$ level checked at the node N11. Therefore, a low level signal is checked at a node N12.

In addition, the PMOS transistor 77 of the latch 200 is turned on in accordance with a low level signal checked at the node N12, and a high level signal of a voltage $V_{cc}$ level is checked at the node N11.

Therefore, since the high level signal of a voltage $V_{cc}$ at the node NI1 is commonly applied to the gate terminals of the PMOS transistor 75 and the NMOS transistor 76, the PMOS transistors 75 and 77 and the NMOS transistor 76 alternately become activated, and a high level signal of a voltage $V_{cc}$ i checked at the node N11 for a predetermined time.

Thereafter, the PMOS transistor 78 and the NMOS transistor 79 of the invertor 300' are turned on and turned off, respectively, in accordance with a low level signal checked at the node N12 and output a high level signal of a voltage $V_{cc}$ level to the common output line thereof.

The NMOS transistor 80 of the level controller 600 is turned on in accordance with a word line selection signal φXi of a high level signal and output a high level signal of a voltage $V_{cc}$ through the common output line of the PMOS transistor 78 and the NMOS transistor 79.

Therefore, a high level signal of a voltage $V_{cc}$ is checked at a node N13.

The PMOS transistor 82 and the NMOS transistor 83 of the word line selector 400' are turned off and turned on, respectively, in accordance with a high level signal of a voltage $V_{cc}$ checked at the node N13 and output a low level signal through the common output line thereof.

Thereafter, the PMOS transistor 81 of the level controller 600 is turned on in accordance with a low level signal outputted from the PMOS transistor 82 and the NMOS transistor 83 and apply a high level signal of a power-up voltage $V_{pp}$ to the node N13, and the high level signal of a voltage $V_{cc}$ checked a the node N13 is convened into a high level signal of a power-up voltage $V_{pp}$.

In addition, since the high level signal converted into the power-up voltage $V_{pp}$ level is commonly applied to the PMOS transistor 82 and the NMOS transistor 83, a low level signal is outputted to the word line W/L through the common output line of the PMOS transistor 82 and the NMOS transistor 83, so that the word line W/L is not driven.

Thereafter, when low address signals $DRA_{ij}$, $DRA_{kl}$, and $DRA_{mn}$ of a high level are applied to the PMOS transistor 71, the NMOS transistor 72, and the NMOS transistors 73a and 74, respectively, the PMOS transistor 71 and the NMOS transistor 72 are turned off and turned on in accordance with a low address signal $DRA_{ij}$.

In addition, the NMOS transistor 73 is turned on in accordance with a low address signal $DRA_{kl}$ of a high level, and the NMOS transistor 74 is turned on in accordance with a low address signal $DRA_{mm}$ of a high level applied to its gate terminal.

Therefore, a low level signal is checked at the node N1 since a low level signal is outputted from the PMOS transistor 71 and the NMOS transistor 72 through the common output line.

Thereafter, the PMOS transistor 75 and the NMOS transistor 76 are turned on and turned off, respectively, in accordance with a low level signal checked at the node N11 and output a high level signal of a voltage $V_{cc}$.

Therefore, a high level signal of a voltage $V_{cc}$ is checked at the node N12.

In addition, the PMOS transistor 77 is turned off in accordance with a high level signal of a voltage $V_{cc}$ level checked at the node N12, and a low level is checked at the node N11 for a predetermined time.

Thereafter, the PMOS transistor 78 and the NMOS transistor 79 are turned off and turned on in accordance with a high level signal of a voltage $V_{pp}$ level checked at the node N12 and output a low level signal through the common output terminal, respectively.

The NMOS transistor 80 is turned on in accordance with a word line selection signal φXi applied thereto for a predetermined time, and a low level signal is checked at the node N13.

Therefore, the PMOS transistor 82 and the NMOS transistor 83 are tamed on and turned off, respectively, in accordance with a low level signal checked at the node N13, and output a high level signal of a power-up voltage $V_{pp}$ level.

The PMOS transistor 81 is mined off in accordance with a high level signal of a power-up voltage $V_{pp}$ level outputted from the common output line of the PMOS transistor 82 and the NMOS transistor 83, and a low level signal is checked at the node N13.

A power-up voltage $V_{pp}$ is checked at the PMOS transistor 82 and the NMOS transistor and applied to the word line W/L, so that the word line W/L is driven.

Next, the operation of a third conventional word line driving circuit for a memory will now be explained.

To begin with, when low address signals $DRA_{ij}$, $DRA_{kl}$ and $DRA_{mn}$ of a low level are applied to the PMOS transistor 101 and the NMOS transistor 103 and the NMOS transistors 104 and 105 of the NAD gate 700, respectively, the PMOS transistor 101 and the NMOS transistor 103 are mined on and turned off, respectively, in accordance with a low address signal $DRA_{ij}$ of a low level applied to the gate terminals thereof.

In addition, the NMOS transistor 104 is tamed off in accordance with a low address signal $DRA_{kl}$ of a low level applied to its gate terminal, and the NMOS transistor 104 is turned off in accordance with a low address signal $DRA_{mn}$ of a low level applied to its gate terminal.

Therefore, the PMOS transistor 101 and the NMOS transistor 103 output a high level signal of a power-up voltage $V_{pp}$, respectively, through the common output line thereof, and the high level signal of the power-up voltage $V_{pp}$ level is inverted by the invertor 701, and a low level signal is checked at a node N22.

In addition, the PMOS transistor 102 is turned on i accordance with a low level signal checked at the node N22, and a high level signal of a power-up voltage $V_{pp}$ level is continually applied to the input line of the invertor 700, and a low level signal is checked at the node N22 for a predetermined time.

Thereafter, the invertor 702 inverts the low level signal outputted from the invertor 701 to the high level signal of a power-up voltage $V_{pp}$ level.

The transmission gate TM of the word line selector 703 is turned off in accordance with a low level signal and a high level signal outputted from the invertors 701 and 702, respectively, and cuts the signal input thereto of the word line signal φXi.

That is, the PMOS transistor 106 of the transmission gate TM receives a high level signal of a power-up voltage $V_{pp}$ outputted from the invertor 702 through its gate terminal, and the NMOS transistor 107 is turned off in accordance with a low level signal outputted from the invertor 701.

In addition, the word line selector 703 is turned on in accordance with a high level signal of a power-up voltage $V_{pp}$ outputted from the invertor 702, and a low level signal is applied to the word line W/L, so that the word line W/L is not driven.

Thereafter, when low address signals $DRA_{ij}$, $DRA_{kl}$, and $DRA_{mn}$ are applied to the gate terminals of the PMOS transistor 101, the NMOS transistor 103 and the NMOS transistors 104 and 105, respectively, the PMOS transistor 101 and the NMOS transistor 103 are turned off and turned on, respectively, in accordance with a high level signal applied to the gate terminals thereof.

In addition, the NMOS transistor 104 is turned on in accordance with a low address signal $DRA_{kl}$ of a high level applied to the gate terminal thereof, and the NMOS transistor 105 is turned on in accordance with a low address signal $DRA_{mn}$ of a high level applied to the gate terminal thereof.

Therefore, a low signal is outputted through the common output line of the PMOS transistor 101 and the NMOS transistor 103 and inverted into a high level signal of a power-up voltage $V_{pp}$ by the invertor 701, and a high level signal of a power-up voltage $V_{pp}$ is checked at the node N22.

In addition, the PMOS transistor 102 is turned off in accordance with a high level signal of a power-up voltage $V_{pp}$ checked at the node N22, and a low level signal is continuously applied to the input line of the invertor 701, and a high level signal of a power-up voltage $V_{pp}$ level is checked at the node N22 continuously, and a low level signal is inverted by the invertor 702.

The PMOS transistor 106 and the NMOS transistor 107 are turned on in accordance with a low level signal and a high level signal, respectively, outputted from the invertors 702 and 701, and the NMOS transistor 108 is turned off in accordance with a low level signal outputted from the invertor 702, and a word line selection signal φXi is applied to the word line W/L, and the word line W/L is driven.

However, as described above, the conventional word line driving circuit for a memory has disadvantages in that when increasing an externally supplied voltage, an over load of a power-up voltage occurs because of using an externally applied power-up voltage so as to drive a word line, so that the power-up voltage becomes unstable due to errors or noise, thus disadvantageously increasing electric power consumption.

SUMMARY OF THE INVENTION

Accordingly, it is an object of the present invention to provide a word line driving circuit for a memory, which overcome the problems encountered in a conventional word line driving circuit for a memory.

It is another object of the present invention to provide an improved word line driving circuit for a memory capable of decoding a free-decoded low address signal to an externally applied voltage level and driving a word line using a power-up voltage level of a memory, thus advantageously achieving a low voltage consumption for driving a word line.

To achieve the above objects, there is provided a word line driving circuit for a memory, which includes a decoder for decoding free-decoded first through third low address signals and an externally applied control signal and for outputting a decoding signal of a voltage level or a low level; a switch for outputting a free-decoded word line enable signal of a power-up voltage level or a low level switched in accordance with a decoding signal outputted from the decoder; a word line selector for outputting a word line selection signal of a power-up voltage and for selecting a word line in accordance with a word line enable signal outputted from the switch; and a word line stabilization circuit for stabilizing the level of a word line selected by the word line selector in accordance with a word line enable signal outputted from the switch.

BRIEF DESCRIPTION OF THE DRAWINGS

FIGS. 5A through 5F are wave forms of each element of FIG. 4 according to the present invention.

DETAILED DESCRIPTION OF THE INVENTION

Figure 1:
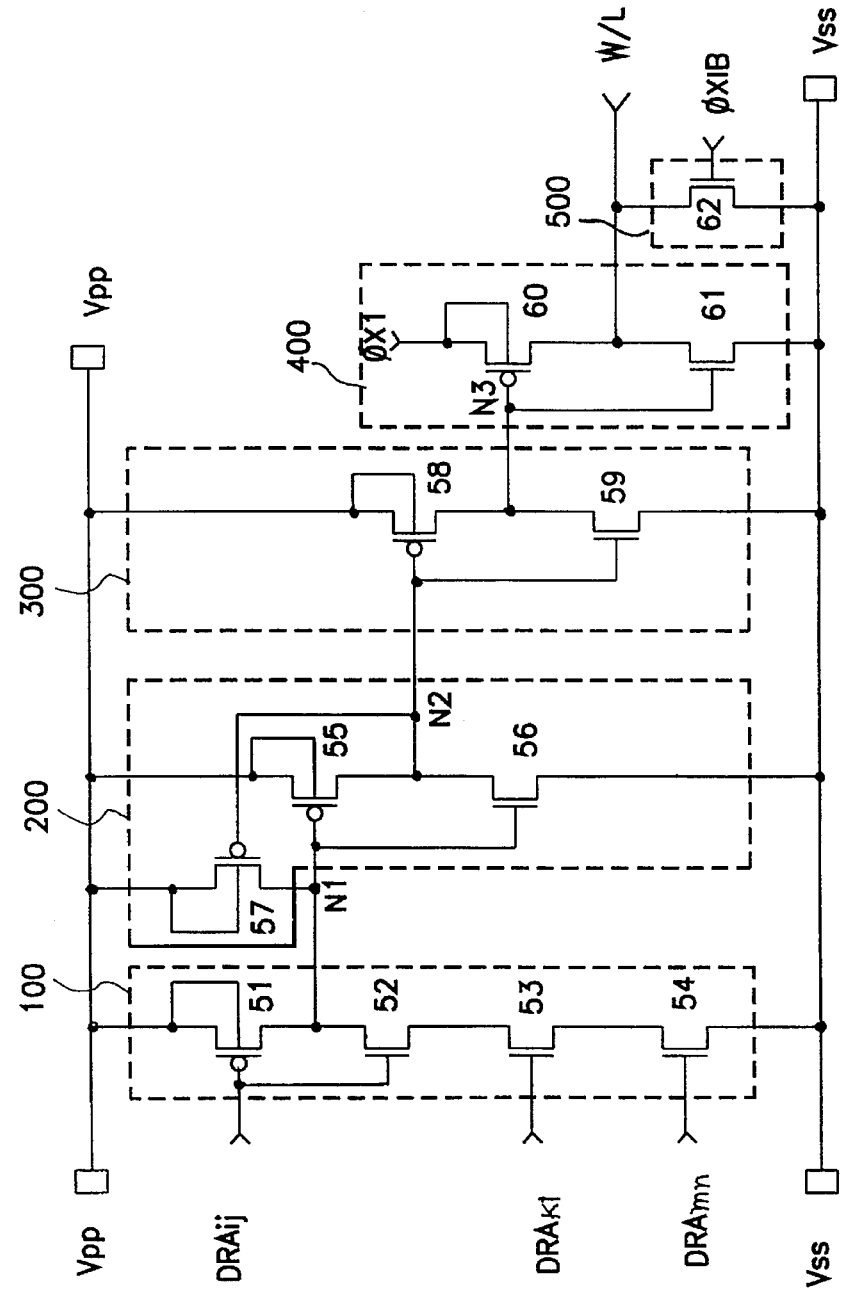
FIG. 1 is a circuit diagram of a first conventional word line driving circuit for a memory.
Figure 2:
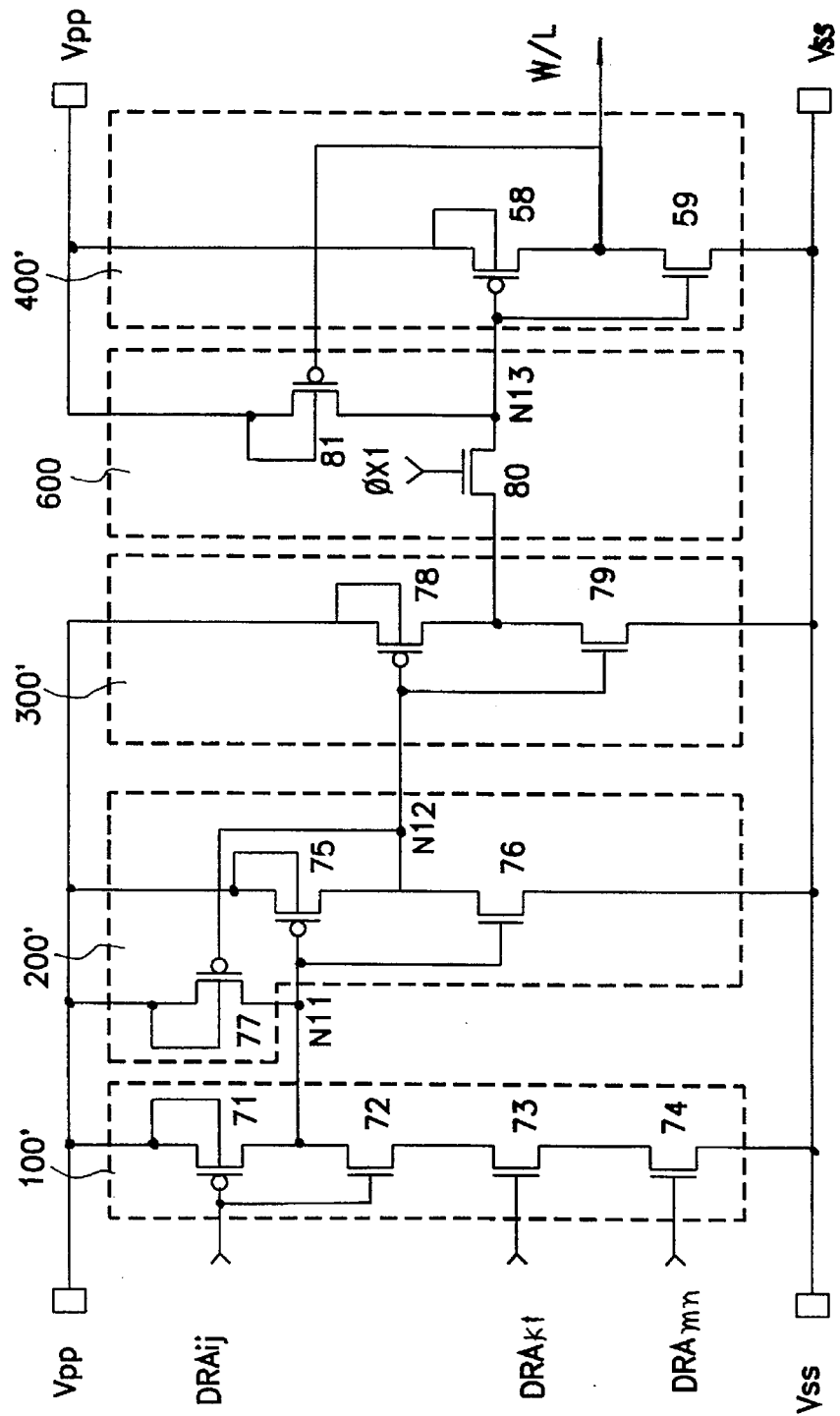
FIG. 2 is a circuit diagram of a second conventional word line driving circuit for a memory.
Figure 3:
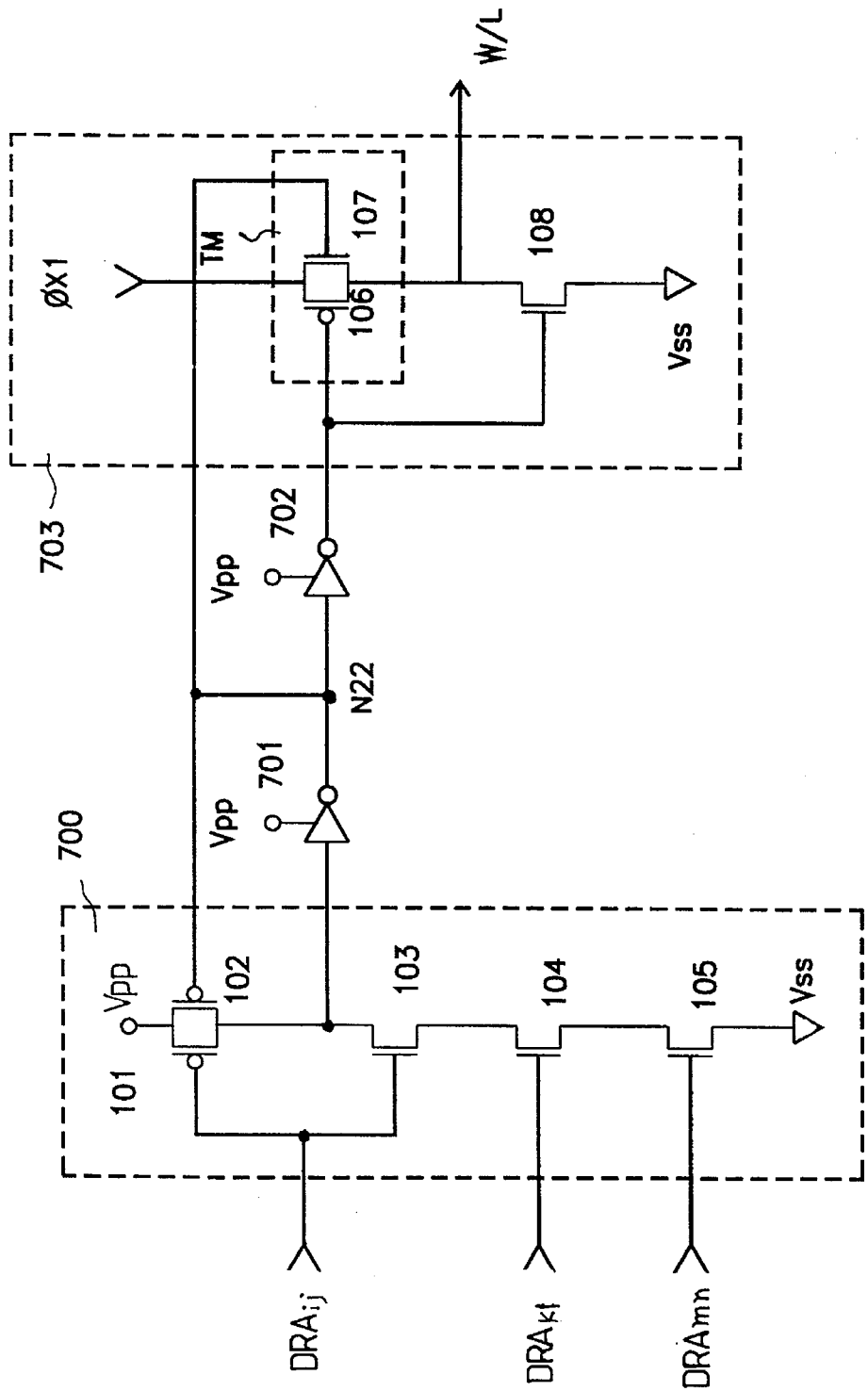
FIG. 3 is a circuit diagram of a third conventional word line driving circuit for a memory.
Figure 4:
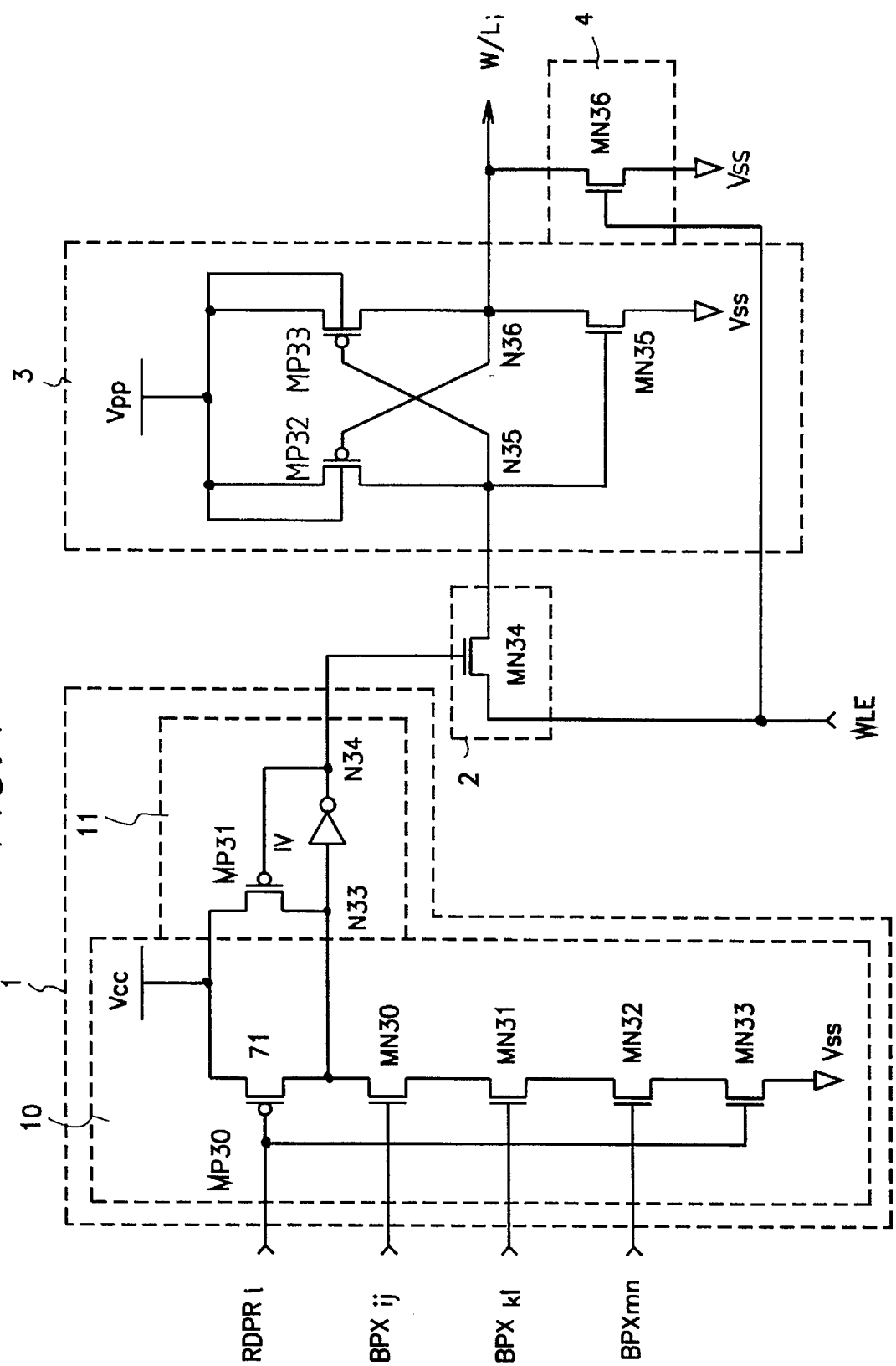
FIG. 4 is a circuit diagram of a word line driving circuit for a memory.

Referring to FIG. 4, a word line driving circuit for a memory according to the present invention will now be explained.

To begin with, the word line driving circuit for a memory includes a decoder 1 for decoding free-decoded low address signals $BPX_{ij}$, $BPX_{kl}$, and $BPX_{mn}$ and an externally applied control signal RDPRi and for outputting a decoding signal of a voltage $V_{cc}$ level or a low level, a switch 2 for outputting a word line enable signal WLE of a power-up voltage $V_{pp}$ or a low level switched and free-decoded in accordance with a decoding signal outputted from the decoder 1, a word line selector 3 for outputting a word line selection signal of a power-up voltage $V_{pp}$ in accordance with a word line enable signal outputted from the switch 2 and for selecting a word line WLi, and a word line stabilization circuit 4 for stabilizing the level of the word line selected by the word line selector 3 in accordance with a word line enable signal WLE outputted from the switch 2.

The decoder 1 includes an NAND gate 10 for NANDing the low address signals $BPX_{ij}$, $BPX_{kl}$, and $BPX_{mn}$ and an externally applied control signal RDPRi and for outputting a logic signal of a voltage $V_{cc}$ level or a low level, and a latch 11 for delaying the level of the logic signal outputted from the NAND gate 10 for a predetermined time and for outputting the inverted logic signal.

The NAND gate 10 includes a PMOS transistor MP30 having a source terminal connected to a voltage $V_{cc}$ and a gate terminal connected to the input line of an externally applied control signal RDPRi, an NMOS transistor MN30 having a drain terminal connected to the drain terminal of the PMOS transistor MP30 and a gate terminal connected to the input line of the low address signal $BPX_{ij}$, an NMOS transistor MN31 having a drain terminal connected to the source terminal of the NMOS transistor MN30 and a gate terminal connected to the input line of the low address signal $BPX_{kl}$, an NMOS transistor MN32 having a drain terminal connected to the source terminal of the NMOS transistor MN31 and a gate terminal connected to the input line of the low address signal $BPX_{mn}$, and an NMOS transistor MN33 having a drain terminal connected to the source terminal of the NMOS transistor MN32 and a gate terminal connected to the gate terminal of the PMOS transistor MP30.

The latch 11 includes an invertor IV having an input terminal connected the common output line of the PMOS transistor MP30 and the NMOS transistor MN30 and an output terminal connected to the input line of the switch 2, and a PMOS transistor MP31 having a source terminal connected to the voltage $V_{cc}$ and a gate terminal connected to the output terminal of the invertor IV and a drain terminal connected to the input terminal of the invertor IV.

The switch 2 includes an NMOS transistor MN34 having a drain terminal connected to the input line of the word line enable signal WLE and a gate terminal connected to the output line of the latch 11 and a source terminal connected to the input line of the word line selector 3.

The word line selector 3 includes PMOS transistors MP32 and MP33 each having a source terminal commonly connected to the power-up voltage $V_{pp}$ and a gate terminal connected to the drain terminals thereof, and an NMOS transistor MN35 having a drain terminal commonly connected to the drain terminal of the PMOS transistor MP33 and the gate terminal of the PMOS transistor MP32 and a gate terminal commonly connected to the drain terminal of the PMOS transistor MP32 and the gate terminal of the PMOS transistor MP33 and a source terminal connected to a ground voltage $V_{ss}$.

The word line stabilization circuit 4 includes an NMOS transistor MN36 having a drain terminal connected to a word line WLi and a gate terminal connected to the input line of the word line enable signal WLE applied to the switch 2 and a source terminal connected to the ground voltage $V_{ss}$ The operation of the word line driving circuit for a memory according to the present invention will now be explained with reference to FIG. 5.

To begin with, with respect to an operation of a word line driving circuit for a memory for a predetermined time T1 shown in FIG. 5, when an externally applied control signal RDPRi and free-decoded low level address signals $BPX_{ij}$, $BPX_{kl}$, and $BPX_{mn}$ are applied to each gate terminal of the PMOS transistor MP30, the NMOS transistor MN33, and the NMOS transistors 30 through 32, respectively, as shown in FIGS. 5A and 5B, the PMOS transistor MP30 and the NMOS transistor MN33 are turned on and turned off in accordance with an eternally applied control signal RDPRi.

In addition, the NMOS transistor MN30 is mined on in accordance with a low address signal $BPX_{ij}$ of a low level applied to the gate terminal thereof, and the NMOS transistor MN31 is turned off in accordance with a low address signal $BPX_{kl}$ applied to the gate terminal thereof, and the NMOS transistor Mn32 is turned on in accordance with a low address signal $BPX_{mn}$ of a low level applied to the gate terminal thereof.

Therefore, a high level signal of a voltage $V_{cc}$ is outputted from the PMOS transistor MP30 and the NMOS transistor MN30 through the common output line, and a high level signal is checked at a node N34.

In addition, the PMOS transistor MP31 of the latch 11 is turned on in accordance with a low level signal checked at the node N34, and a high level signal of a voltage $V_{cc}$ is checked at a node N33.

Therefore, the high level signal of a voltage $V_{cc}$ checked at the node N33 is applied to the input terminal of the invertor IV, and a low level signal is checked at the node N34.

Thereafter, the NMOS transistor MN34 of the switch MN34 is turned off in accordance with a low level signal checked at the node N34, and a word line enable signal WLE of a power-up voltage $V_{pp}$ is cut as shown in FIG. 5C.

In addition, the NMOS transistor MN36 of the word line stabilization 4 is turned on in accordance with a word line enable signal WLE of a power-up voltage $V_{pp}$ applied to the drain terminal of the NMOS transistor MN34, and a high level signal of a power-up voltage $V_{pp}$ at a node N36 is connected to the source terminal of the NMOS transistor MN36, and a low level signal is checked at a node N36.

Thereafter, the PMOS transistor MP32 is turned on in accordance with a low level signal checked at the node N36, and a high level signal of a power-up voltage $V_{pp}$ is checked at a node N35 as shown in FIG. 5E.

Therefore, the PMOS transistor MP33 and the NMOS transistor MN35 are turned off and turned on, respectively, in accordance with a high level signal of a power-up voltage $V_{pp}$ checked at the node N35, and a low level signal is checked at the node N36 as shown in FIG. 5F, and the word line WLi is not driven.

Thereafter, with respect to an operation of the word line driving circuit for a memory for a predetermined time T2, as shown in FIGS. 5a and 5B, when an externally applied control signal RDPRif a voltage $V_{cc}$ and free-decoded low address signals $BPX_{ij}$, $BPX_{kl}$, $BPX_{mn}$ of a voltage $V_{cc}$ level are applied to each gate of the PMOS transistor MP30, the NMOS transistor MN33 and the NMOS transistors MN30 through MN32, the PMOS transistor MP30 and the NMOS transistor Mn33 are turned off and turned on, respectively, in accordance with an externally control signal RDPRi of a voltage $V_{cc}$ level applied to the gate terminal thereof.

In addition, the NMOS transistor MN30 is turned on in accordance with a low address signal $BPX_{ij}$ of a voltage $V_{cc}$ level applied to the gate terminal thereof, and the NMOS transistor MN31 is turned on in accordance with a low address signal $BPX_{kl}$ of a voltage $V_{cc}$ level, and the NMOS transistor MN32 is turned on in accordance with a low address signal $BPX_{mn}$ of a voltage $V_{cc}$ level.

Therefore, a low level signal is outputted from the common output line of the PMOS transistor MP30 and the NMOS transistor MN30, and the low level signal is checked at a node N33.

Thereafter, the invertor IV inverts the low level signal outputted through the node N33, and outputs a high level signal of a voltage $V_{cc}$ as shown in FIG. 4D, and a high level signal of a voltage $V_{cc}$ is checked at a node N34.

In addition, the PMOS transistor MP31 is turned off in accordance with a high level signal of a voltage $V_{cc}$ checked at the node N34, and a low level signal is checked at the node N34 continuously.

Therefore, since the low signal checked at the node N33 is applied to the input terminal of the invertor IV again, a high level signal of a voltage $V_{cc}$ is checked at the node N34 continuously.

Thereafter, the NMOS transistor MN34 is tamed on in accordance with a high level signal of a voltage $V_{cc}$ checked at the node N34 and outputs the low level signal shown in FIG. 5C to the source terminal.

Therefore, a low level signal is checked at the node N35 as shown in FIG. 5E.

The PMOS transistor MP33 and the NMOS transistor MN35 are turned on and turned off, respectively, in accordance with a low level signal checked at the node N35, and the NMOS transistor MN36 of the word line stabilization 4 is turned off in accordance with a word line enable signal WLE of a low level applied to the drain terminal of the NMOS transistor MN34.

Therefore, the PMOS transistor MP32 is turned off in accordance with a high level signal of a power-up voltage $V_{pp}$ checked at the node N36, and the high level signal of a power-up voltage $V_{pp}$ is checked at the nodes N34 and N35 continuously as shown in FIG. 5E.

Therefore, a high level signal of a power-up voltage $V_{pp}$ is checked at the word line WLi as shown in FIG. 5F, so that the word line WLi is driven.

As described above, the word line driving circuit for a memory according to the present invention is directed to decoding an address signal applied thereto to a voltage level, thus driving a word line using a power-up voltage level applied from the interior of a memory, so that the load of a power-up voltage can advantageously be reduced, and the consumption of electric power can be reduced.

What is claimed is:

1. A word line driving circuit for a memory, comprising:

decoding means for decoding free-decoded first through third low address signals and an externally applied control signal and for outputting a decoding signal of a voltage level or a low level;

switching means for outputting a free-decoded word line enable signal of a power-up voltage level or a low level switched in accordance with a decoding signal outputted from said decoding means;

word line selecting means for outputting a word line selection signal of a power-up voltage and for selecting a word line in accordance with a word line enable signal outputted from said switching means; and word line stabilization means for stabilizing the level of a word line selected by said word line selection means in accordance with a word line enable signal outputted from said switching means.

2. The circuit of claim 1, wherein said decoding means includes:

an NAND gate for NANDing first through third low address signals and an externally applied control signal and for outputting a logic signal of a voltage level or a low level; and a latch for delaying the level of the logic signal outputted from said NAND gate for a predetermined time, and for outputting an inverted logic signal.

3. The circuit of claim 2, wherein said NAND gate includes:

a PMOS transistor having a source terminal connected to a voltage terminal and a gate terminal connected to the input line of an eternally applied control signal;

a first NMOS transistor having a drain terminal connected to the drain terminal of said PMOS transistor and a gate terminal connected to the input line of a first low address signal;

a second NMOS transistor having a drain terminal connected to the source terminal of said first NMOS transistor and a gate terminal connected to the input line of a second low address signal;

a third NMOS transistor having a drain terminal connected to the source terminal of said second NMOS transistor and a gate terminal connected to the input line of a third low address signal; and a fourth NMOS transistor having a drain terminal connected to the source terminal of said third NMOS transistor and a gate terminal connected to the gate terminal of the PMOS transistor and a source terminal connected to a ground voltage terminal.

4. The circuit of claim 2, wherein said latch includes;

an invertor having an input line connected to the output line of the NANDS gate; and a PMOS transistor having a source gate connected to a voltage terminal, a gate terminal connected to the output terminal of said invertor, and a drain terminal connected to the input terminal of the invertor.

5. The circuit of claim 1, wherein said switching means includes an NMOS transistor having a drain terminal connected to the input line of a word line enable signal, a gate terminal connected to the output line of the decoding means, and a source terminal connected to the input line of the word line selecting means.

6. The circuit of claim 1, wherein said word line selecting means includes:

a first PMOS transistor having a source terminal connected to a power-up voltage terminal and a gate terminal connected to a drain terminal of a second PMOS transistor having a source terminal connected to a power-up voltage terminal and a gate terminal connected to a drain terminal of the first PMOS transistor; and an NMOS transistor having a drain terminal commonly connected to the gate terminal of the first PMOS transistor and the drain terminal of the second PMOS transistor, a gate terminal commonly connected to the first PMOS transistor and the gate terminal of the second PMOS transistor, and a source terminal connected to a ground voltage terminal.

7. The circuit of claim 1, wherein said word line stabilization includes an NMOS transistor having a drain terminal connected to a word line, a gate terminal connected to the input line of a word line enable signal applied to the switching means, and a source terminal connected to a ground voltage terminal.

* * * * *